United States Patent [19]
Kinose et al.

[11] Patent Number: 5,782,978
[45] Date of Patent: Jul. 21, 1998

[54] COATING DEVICE WITH MOVABLE FLUID SUPPLY NOZZLE AND ROTATABLE SUBSTRATE HOLDER

[75] Inventors: Kazuo Kinose; Takeshi Yonezawa. both of Hikone; Taimi Oketani. Matsusaka; Tomoo Yamamoto. Nara. all of Japan

[73] Assignee: Sharp Kabushiki Kaisha. Osaka. Japan

[21] Appl. No.: 876,866

[22] Filed: Jun. 16, 1997

Related U.S. Application Data

[63] Continuation of Ser. No. 422,316, Apr. 13, 1995, abandoned.

[30] Foreign Application Priority Data

Apr. 15, 1994 [JP] Japan ................. 6-077653

[51] Int. Cl.$^6$ ................. B05C 5/00; B05C 11/08
[52] U.S. Cl. ................. 118/321; 118/319; 118/320
[58] Field of Search ................. 118/313, 319, 118/320, 321, 323

[56] References Cited

U.S. PATENT DOCUMENTS

| | | | |
|---|---|---|---|
| 4,267,212 | 5/1981 | Sakawaki | 427/240 |
| 4,451,507 | 5/1984 | Beltz et al. | 427/240 |
| 5,156,681 | 10/1992 | Harlan | 118/320 |
| 5,215,622 | 6/1993 | Schmeizer | 156/566 |
| 5,234,499 | 8/1993 | Sasaki et al. | 118/52 |
| 5,250,116 | 10/1993 | Tanimoto | |
| 5,252,137 | 10/1993 | Tayeyama et al. | 134/34 |
| 5,374,312 | 12/1994 | Hasebe et al. | 118/52 |

FOREIGN PATENT DOCUMENTS

| | | |
|---|---|---|
| 0264957 | 4/1988 | European Pat. Off. |
| 0383356 | 8/1990 | European Pat. Off. |
| 0454314 | 10/1991 | European Pat. Off. |
| 0594252 | 4/1994 | European Pat. Off. |
| 2746519 | 4/1978 | Germany. |
| 58-170565 | 10/1983 | Japan. |
| 63-209769 | 8/1988 | Japan. |
| 1-135565 | 5/1989 | Japan. |
| 4-61955 | 2/1992 | Japan. |
| 4-99266 | 8/1992 | Japan. |
| 4-332116 | 11/1992 | Japan. |
| 5-136040 | 6/1993 | Japan. |
| 5-158055 | 6/1993 | Japan. |
| 5-166713 | 7/1993 | Japan. |

*Primary Examiner*—Donald E. Czaja
*Assistant Examiner*—Steven B. Leavitt
*Attorney, Agent, or Firm*—Ostrolenk, Faber, Gerb & Soffen, LLP

[57] ABSTRACT

A fluid application apparatus of the present invention includes a rotatable substrate holding mechanism (4), a photoresist liquid supply portion (5) and a motor mechanism (26). The photoresist liquid supply portion (5) supplies resist fluid to a region smaller than the entire region of the substrate surface while moving in the horizontal direction relative to the substrate holding mechanism (4). The motor mechanism (26) rotates the substrate holding mechanism (4) to diffuse the resist fluid over the entire surface of the substrate and form a resist layer having a predetermined thickness.

17 Claims, 8 Drawing Sheets

COATING DEVICE WITH MOVABLE FLUID SUPPLY NOZZLE AND ROTATABLE SUBSTRATE HOLDER

This is a continuation of application Ser. No. 08/422,316 filed on Apr. 13, 1995, now abandoned.

BACKGROUND OF THE INVENTION

A) Field of the Invention

The present invention relates to a coating device and method for coating a surface of a substrate with a predetermined liquid, such as a photoresist liquid.

B) Description of the Related Art

There are numerous devices for coating a substrate, such as a rectangular glass substrate, with a photoresist liquid in order to manufacture a liquid crystal display (LCD). For instance, the devices shown in Japanese Laid-open patent application Nos. Hei 4-61955, and Hei 1-135565 apply liquid to a substrate. In such devices, the substrate is held horizontally by a rotatable chuck. The photoresist liquid is dropped on the central portion of the upper surface of the substrate through a supply nozzle, while the substrate is held in a stationary position by the chuck Thereafter, the rotatable chuck is rotated thus rotating the substrate. As the substrate rotates, centrifugal force generated by the rotation of the substrate causes the photoresist liquid to spread over the entire upper surface of the substrate. Some of the photoresist fluid thrown from the substrate's center by the centrifugal force, scatters around the periphery and is wasted.

The quantity of photoresist fluid necessary to form a photoresist layer having a predetermined thickness on a substrate surface can be calculated based upon the thickness and size of the substrate. However, in the above described devices, such calculations are, for the most part, meaningless because of the amount of liquid lost due to scattering beyond the periphery of the substrate during rotation.

SUMMARY OF THE INVENTION

One object of the present invention is to provide a device which can apply a liquid, forming a thin layer of a predetermined liquid on the surface of a substrate using a minimal amount of liquid to reduce the amount of waste liquid in comparison with the prior art devices.

Another object of the present invention is to provide a coating method which can form a thin layer of a predetermined liquid on the surface of a substrate by using a minimal amount of liquid to decrease waste as compared to prior art methods.

In one aspect of the present invention, a coating device includes means for holding the substrate horizontally, means for supplying a predetermined liquid to an area smaller than the whole area of the surface of the substrate, the supplying means including a liquid supply nozzle relatively movable along the surface of the substrate to supply the liquid on an upper surface portion of the substrate, and means for rotating the substrate held by the holding means around a rotational axis extending vertically after the liquid is supplied on the upper surface area of the substrate, to expand the liquid to the whole upper surface of the substrate.

In another aspect of the present invention, the coating device liquid supply nozzle has a liquid supply outlet through which the liquid is supplied onto the surface of the substrate, the liquid supply outlet having a length smaller than the length of the surface of the substrate with respect to the direction along the length of the liquid supply outlet In yet another aspect of the invention, the substrate has rectangular shape and the liquid supplying means includes means for shifting the liquid supply nozzle in a direction perpendicular to the length of the liquid supply outlet In yet another aspect of the invention, the liquid supplying means further includes means for temporarily storing the liquid to be supplied to the surface of the substrate through the liquid supply outlet The liquid supplying means includes means for rotating the substrate held by the holding means around the rotational axis while supplying the liquid to the surface of the substrate through the liquid supply nozzle.

In yet another aspect of the invention, the substrate has a disc shape and the liquid supplying means includes means for relatively rotating the substrate around the rotational axis after the liquid is supplied thereto.

The invention further includes a coating method for coating a surface of a substrate with a predetermined liquid, including the step of supplying a predetermined liquid to less than the whole area of the surface of the substrate by relatively moving a liquid supply nozzle, having a liquid supply outlet through which the predetermined liquid is supplied to less than the entire upper surface of the substrate, and spreading the liquid using centrifugal force to expand the liquid to cover the entire area surface of that upper substrate.

The coating method is applicable to a substrate having a rectangular shape and wherein the liquid supplying step includes moving the liquid supply nozzle in a direction perpendicular to the length of the liquid supply outlet.

The coating method is also applicable to a substrate having a disc shape and wherein the liquid supplying step includes relatively rotating the substrate around a rotational axis as the liquid is supplied.

In another aspect of the present invention, a fluid application apparatus for applying a fluid to the surface of a substrate includes a selectively rotatable substrate retention device that retains a substrate in a generally horizontal orientation, a fluid supply nozzle selectively positionable adjacent to an upper surface of the substrate for supplying fluid to at least a portion of that surface, selectively movable in a horizontal direction relative to the surface, the nozzle having at least one fluid supply outlet for generally evenly applying the fluid, a fluid supply means for supplying fluid to the nozzle, and control means for controlling rotation of the substrate retention device, movement of the nozzle with respect to the substrate and the fluid supply means.

In another aspect of the present invention, the fluid application apparatus accommodates a substrate having a horizontal length and horizontal width where the length of the substrate extends in a first direction and the width of the substrate extends in a second direction, and the fluid supply outlet is formed as a single elongated opening that extends a distance relative to the substrate in the second direction smaller that the width of the substrate. Further, the nozzle is moveable in the first direction at a right angle to the second direction.

In another aspect of the invention, the nozzle is formed with a fluid accumulator on the upstream side of the fluid supply outlet.

In a further aspect of the invention, the nozzle has a fluid supply outlet that is formed as a plurality of spaced apart openings.

The present invention further relates to a method for applying fluid to a substrate wherein the method includes the steps of.

positioning a fluid applying nozzle adjacent to a generally horizontal surface of a substrate;

discharge fluid from the nozzle;

moving of either the nozzle or the substrate to spread the fluid on the surface of the substrate;

stopping discharge of the fluid from the nozzle such that a predetermined region of the substrate smaller than the entire surface of the substrate is coated with fluid;

stopping movement of either the nozzle or the substrate;

moving the nozzle away from the substrate;

rotating the substrate so that centrifugal force spreads the fluid across the entire surface of the substrate.

In another aspect of the present invention, the moving step in the method of applying a fluid to a substrate surface can be either of two movements. For instance, in one embodiment, the moving step includes generally horizontal movement of the nozzle and stationary positioning of the substrate. In another embodiment, the moving step includes stationary positioning of the nozzle and rotation of the substrate.

The process fluid supply method supplies fluid to a region smaller than the entire substrate surface. The rotation of the substrate after fluid is applied, diffuses fluid over the entire surface of the substrate to create a resist layer with a predetermined film thickness.

Here, because process fluid is supplied to a region smaller than the entire region of the substrate surface, the amount of process fluid flying off of the substrate is reduced.

In the process fluid application apparatus, when the process fluid supply method includes a nozzle extending in a first direction along the upper surface of the substrate retention portion that has a process fluid supply outlet shorter than the length of the substrate of this first direction, process fluid can be easily supplied at a specified region with a simple construction. Further, when the substrate is a rectangle, and when the process fluid supply method includes a movement method to move the nozzle in a second direction at a right angle to the first direction, process fluid can be supplied to a specified region with a construction simpler than moving the substrate retention portion. Moreover, when the nozzle has a fluid accumulator on the upstream side of the process fluid supply outlet, process fluid can be supplied more evenly supplied in the direction downstream of the process fluid supply outlet.

In the process fluid application method, when the substrate is a rectangle and when the supply process includes a process of moving the process fluid supply nozzle in one direction along the upper surface of the substrate, process fluid can be easily supplied to an entire specified surface. Furthermore, when the substrate is a disc and when the supply process includes a process that rotates the substrate, a mechanism and process that move the process fluid supply nozzle become unnecessary.

These and other objects, features, aspects and advantages of the present invention will become more fully apparent from the following detailed description of the present invention when taken in conjunction with the accompanying drawings where like reference numerals denote corresponding parts throughout, in which:

BRIEF DESCRIPTION OF THE DRAWINGS

FIGS. 10(a) and 10(b) are top views similar to FIG. 9, showing the relationship between a substrate and the nozzle. In FIG. 10(a) such relationship is shown during rotation of the substrate; and 10(b) such relationship is shown after rotation of the substrate has ceased and the head has been moved away from the substrate;

DETAILED DESCRIPTION OF THE PREFERRED EMBODIMENTS

Figure 1:
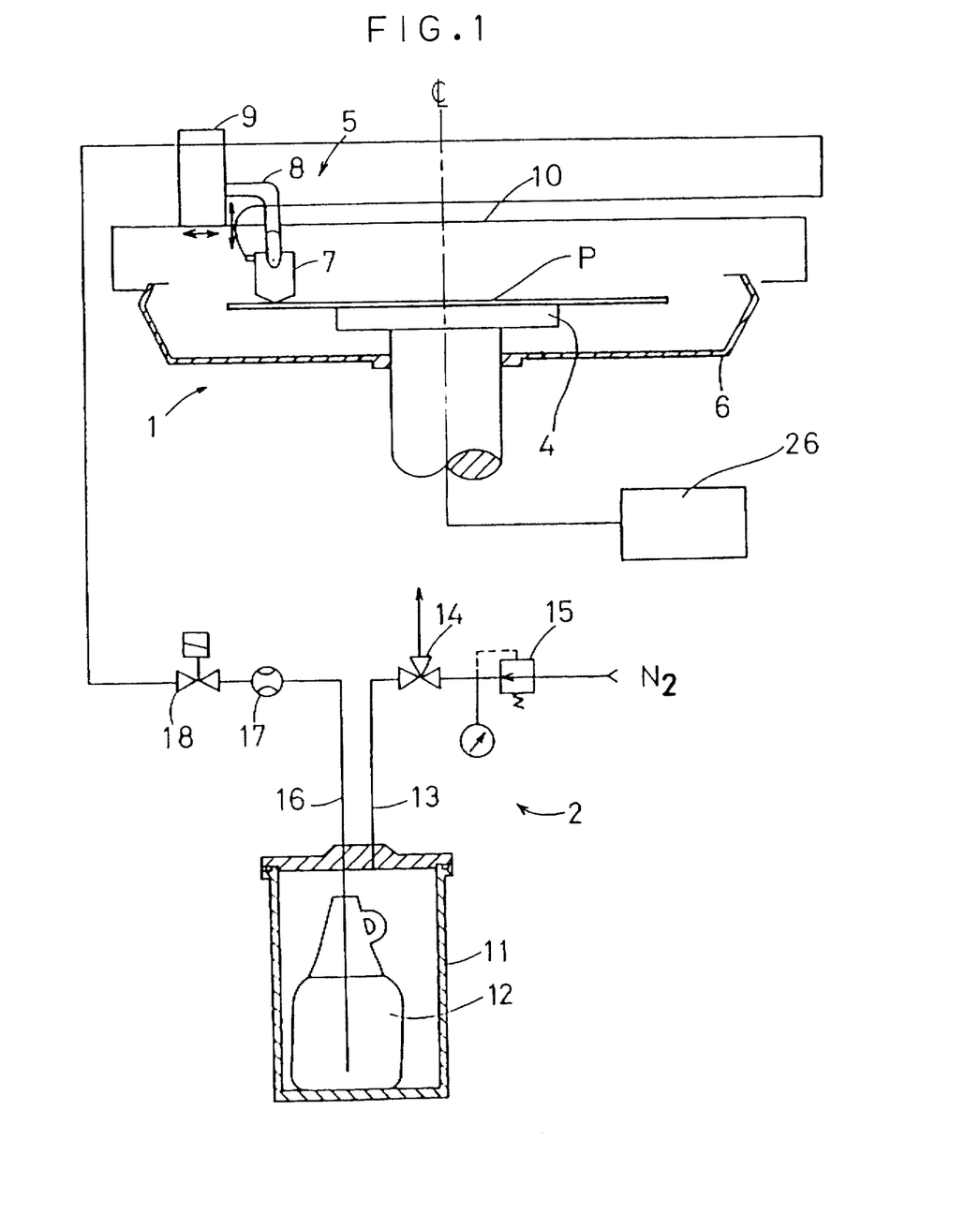
FIG. 1 is a schematic diagram, including part of coating device, having a movable nozzle, constructed in accordance with a preferred embodiment of the present invention for coating a rectangular substrate.

In FIG. 1, a photoresist coating device is depicted in a preferred embodiment of the invention and includes a substrate processing portion (1), a photoresist liquid supply portion (2) and a motor mechanism (26). In the coating device, a photoresist liquid is applied and a coating process carried out to coat a rectangular substrate P as shown in FIGS. 2 and 8.

Figure 2:
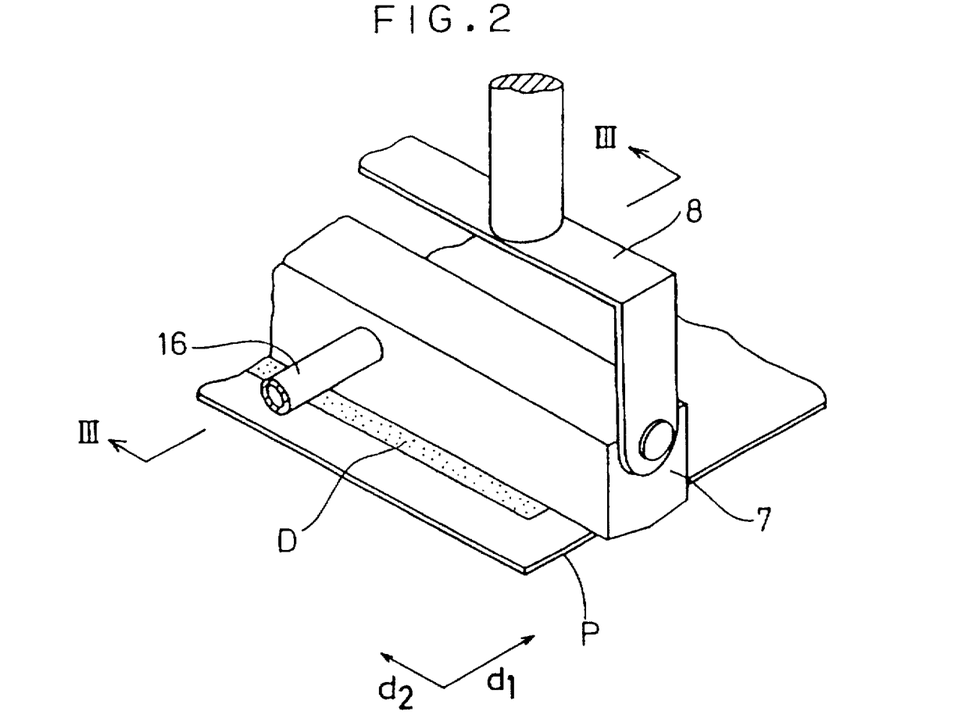
FIG. 2 is an enlarged fragmentary, perspective of the nozzle used with the coating device depicted in FIG. 1.

The substrate processing portion (1), shown in FIG. 1, includes a substrate holding mechanism (4) that holds a rectangular shaped substrate P using a plurality of vacuum suction holes (not shown), and retains the substrate P such that the longest side of the substrate P is held in a first direction $d_1$ (see FIG. 2). The substrate processing portion (1) also includes a photoresist liquid supply portion (5) that supplies photoresist liquid to the substrate P retained by the substrate holding mechanism (4) as will be described further below. The substrate holding mechanism (4) is freely rotatable by motor mechanism (26). A cup shaped spatter guard (6) is located at the outside of the substrate holding mechanism (4) such that the rim is above the periphery of the substrate P to prevent scattering of the photoresist liquid during rotation of the substrate due to centrifugal force.

Figure 3:
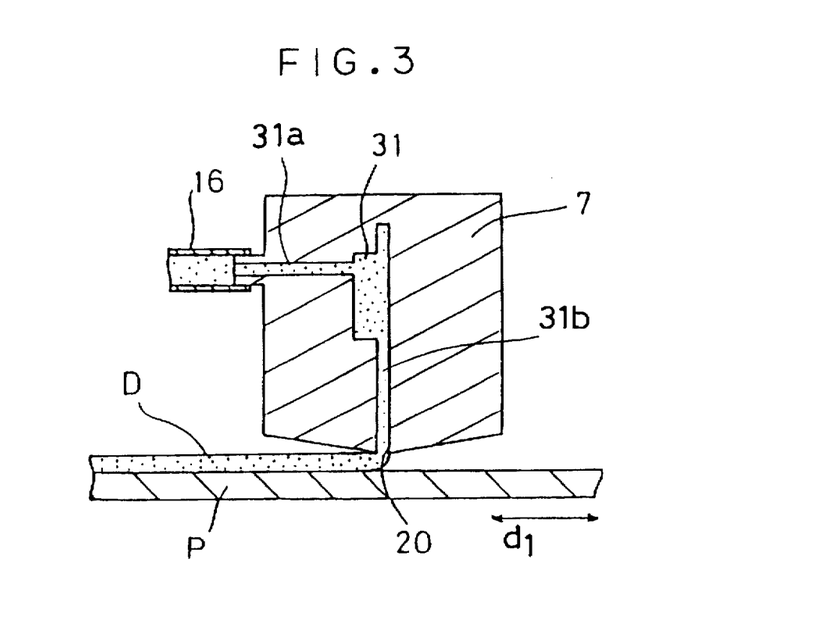
FIG. 3 is cross-section view taken along the line III—III in FIG. 2, looking in the direction of the arrows.
Figure 8:
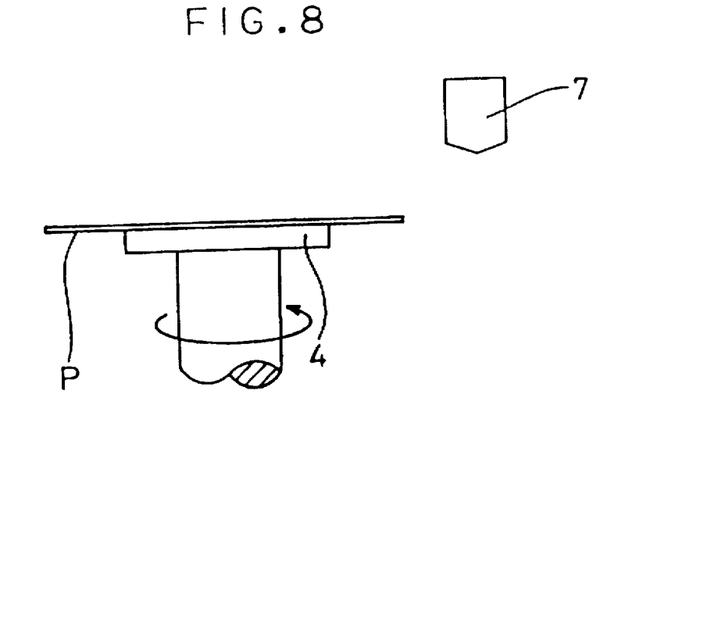
FIG. 8 is an elevation of the coating device showing the nozzle retracted away from the substrate during rotation of the substrate.

As shown in FIGS. 1, 2 and 8, the photoresist liquid supply portion (5) has a supply nozzle (7). The length of the nozzle (7) is disposed over the short side of the rectangular substrate P in a second direction $d_2$ perpendicular to the first direction $d_1$. As shown in FIG. 3, the cross section of the nozzle (7) is shaped like an inverted house. The bottom surface of the nozzle (7) is tapered to form an elongated point along the length of the nozzle at its lowest, most central point. The nozzle (7) is formed with a liquid path which includes a liquid supply inlet (31a), a storing chamber (31), and a liquid supply outlet (31b), as shown in FIG. 3. At the end of the liquid supply outlet (31b) and at the lengthwise tip of the nozzle (7), there is formed a slit shaped opening (20). (20) which is generally shorter than the width of the short side of the substrate P. The nozzle (7) is supported on a movable frame (9) via a nozzle support arm (8). Which is movably supported on the movable frame (9) to move selectively up and down relative to the substrate P. The movement guide (10) extends along the first direction $d_1$ and supports movement of frame (9) such that the movable frame (9), along with the support arm (8) and nozzle (7), can move freely in the first direction $d_1$. Accordingly, the nozzle (7) moves along the upper surface of the substrate P in the first direction $d_1$ in order to supply photoresist liquid to a predetermined region smaller than the entire region of the upper surface of the substrate P.

As is shown in FIG. 3, liquid storing chamber (31), liquid supply inlet (31a) and the liquid supply outlet (31b) are formed inside of nozzle (7). The liquid storing chamber (31) is formed with a width wider than outlet (31b) and the opening (20). The purpose of providing the liquid storing chamber (31) is to evenly diffuse the photoresist liquid supplied from a photoresist liquid supply pipe (16) (described below) through the nozzle (7) and on to the substrate P.

As shown in FIG. 1, the resist photoresist liquid supply portion (2) has a liquid tank (12), a pressure tank (11) and a pressure pipe (13). The liquid tank (12) storing photoresist liquid to be supplied, is disposed within the pressure tank (11). Which is sealed to be airtight. The pressure pipe (13) connects the top of the pressure tank (11) to a nitrogen gas source (not shown). On the pressure pipe (13) is attached a 3-way supply/discharge valve (14) and a regulator (15) which are respectively arranged along the pressure pipe 13a shown in FIG. 1.

The 3-way valve (14) allows for nitrogen gas to be selectively supplied to the pressure tank (11) or expelled from it, as is shown in FIG. 1. One end of the photoresist liquid supply pipe (16) protrudes into the liquid tank (12), extending close to the bottom thereof. The other end of the supply pipe (16) is connected to the nozzle (7). In a mid-portion of the photoresist liquid supply pipe (16) between the liquid tank and the nozzle (7) a flow-rate meter (17) and photoresist liquid supply valve (18) are disposed.

Figure 4:
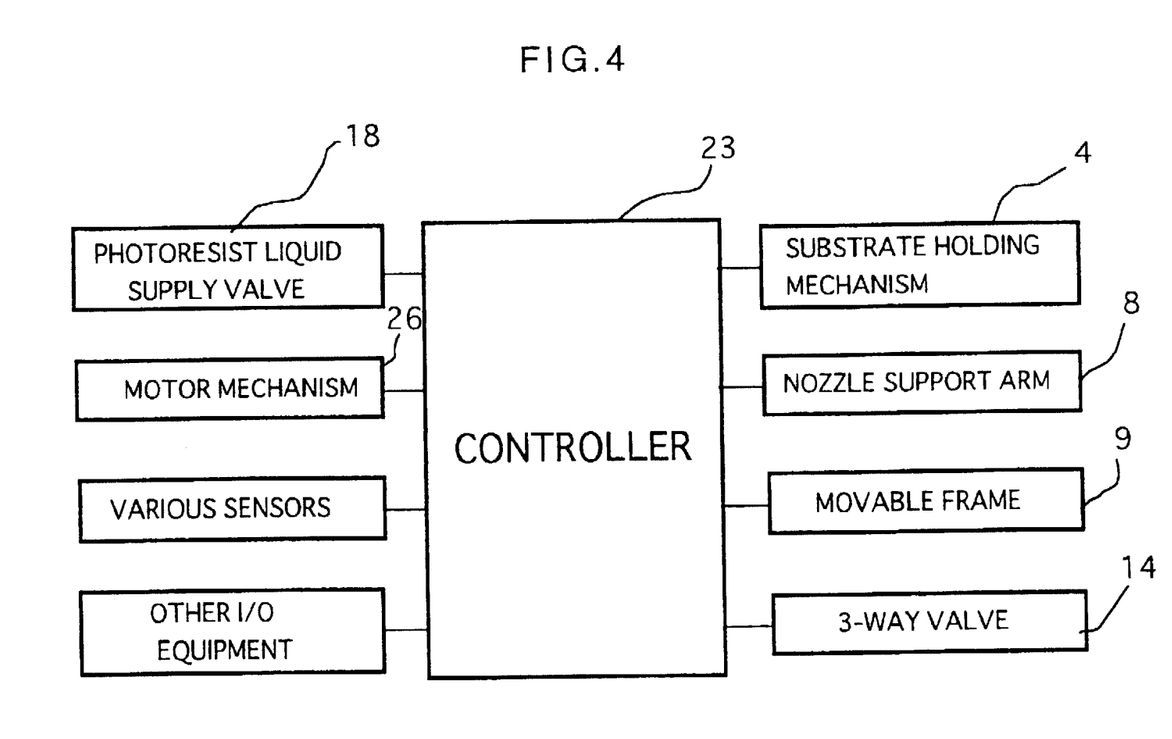
FIG. 4 is a block diagram showing a controller connected to various portions of the coating device depicted in FIG. 1.

As shown in FIG. 4, the coating device includes a controller (23) which includes a microprocessor or a microcomputer. Connected to the controller (23) are the substrate holding mechanism (4) which includes a vacuum chuck, the nozzle support arm (8) and a drive portion of the movably frame (9), the 3-way supply/discharge valve (14), the photoresist liquid supply valve (18) and the motor mechanism (26). Also, various sensors (not shown) are connected to the controller (23) and other I/O apparatus, which detect the position of the nozzle support arm (8) and the movable frame (9).

Figure 5:
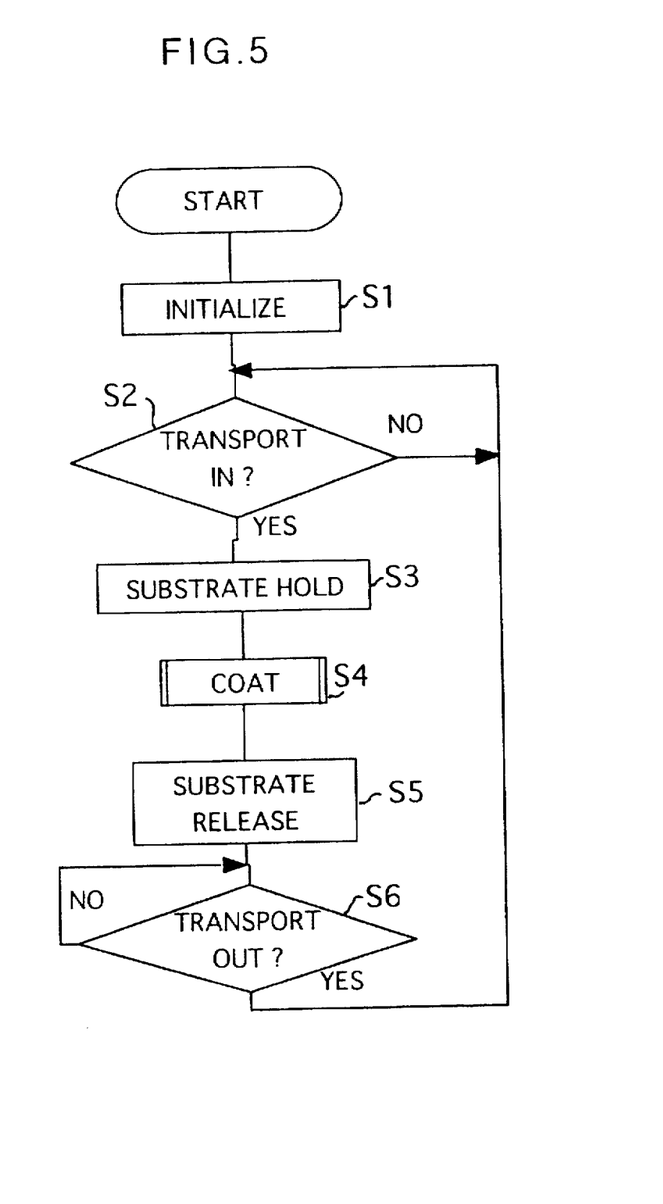
FIG. 5 is a flowchart showing operational steps of the coating device depicted in FIG. 1.
Figure 6:
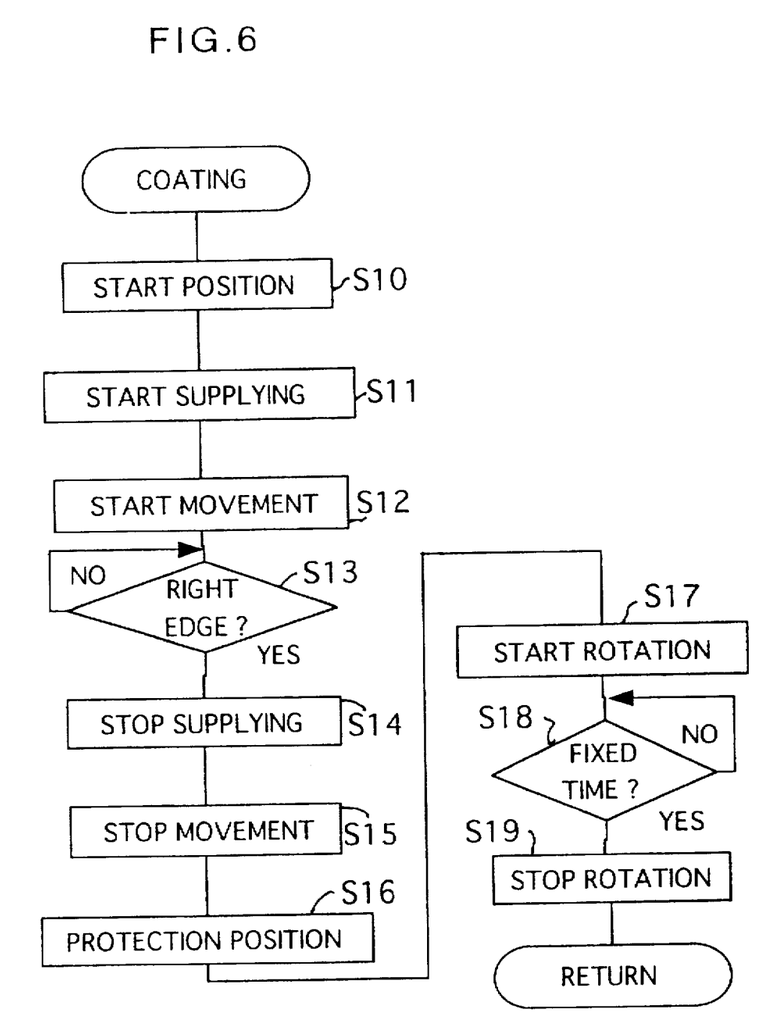
FIG. 6 is a flowchart showing the coating step depicted in the flowchart in FIG. 5.
Figure 7:
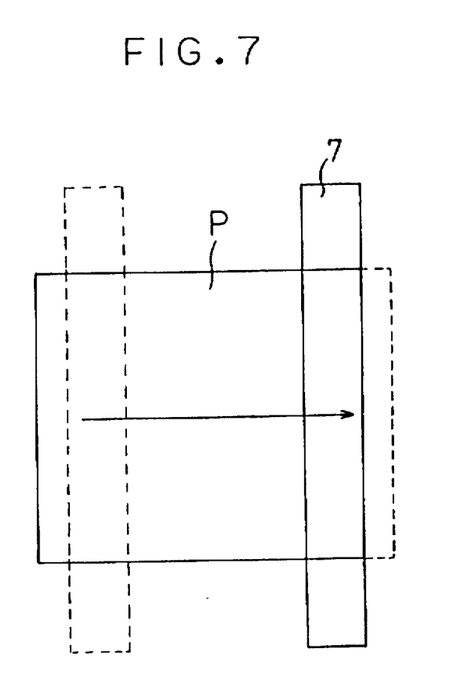
FIG. 7 is a top view showing positions of the nozzle of the coating device with respect to the substrate.

The operation of the coating device is explained in the flowcharts shown in FIGS. 5 to 7. For instance, the controller may be programmed to perform the steps described below.

In step S1 of FIG. 5 the settings for the entire coating device are initialized. Next, in step S2 a transport mechanism (not shown) transports the substrate P to the substrate holding mechanism (4). After the substrate P is transported into position, the substrate P is held by vacuum suction by the substrate holding mechanism (4) in step S3.

The coating process is carried out in step S4, shown in FIG. 6.

Entering step S4, the nozzle (7) is moved to a predetermined start position at step S10 in FIG. 6. Here, the nozzle (7) is arranged at a predetermined distance from one edge of the substrate P, as shown in FIG. 7. In step S11, photoresist liquid is released from the slit (20) of the nozzle (7) to the substrate P. At the start of this supply operation, the controller (23) adjusts the 3-way valve (14) to the supply setting and further opens the photoresist liquid supply valve (18) to supply photoresist liquid from the liquid tank (12) to the nozzle (7). In step S12, the movement of the movable frame (9), support arm (8) and nozzle (7) begins horizontally relative to the movement guide (10) and, as shown in FIG. 2 and 3, photoresist liquid D is applied to the substrate P.

In step S13 it is determined whether or not the nozzle (7) has moved in the first direction $d_1$ a predetermined distance from right edge of substrate P. Upon nozzle (7) having moved the predetermined distance, the 3-way valve (14) is switched to cut off the flow of nitrogen gas into the pressure tank (11), and the photoresist liquid supply valve (18) is closed stopping the supply of photoresist liquid D in step S14. In step S15, movement of the nozzle (7) is stopped. Then, as shown in FIG. 6, the nozzle (7) is moved to a predetermined protective position away from the substrate P so as not to interfere with subsequent operations in step S16.

In step S17, the motor mechanism (26) rotates the substrate holding mechanism (4), and the substrate P, at a low speed in a direction shown by the arrow in FIG. 8. The substrate P is then rotated continuously for a predetermined time period. During this time, centrifugal force is created by the rotation of the substrate holding mechanism (4), the centrifugal force affecting the photoresist liquid D on the upper surface of the substrate P moving the fluid D in an outer peripheral direction. As a result, the photoresist liquid D diffuses evenly about the entire surface region of the substrate P forming a generally uniform photoresist liquid layer on the upper surface of the substrate P with an even thickness. The rotation of the substrate P is continued until a predetermined time has passed. Once the predetermined time has passed, the rotation of the motor mechanism (26) is stopped in step S19. Once rotation is stopped, the operation returns to the main routine in FIG. 5.

In step S5 of FIG. 5, the vacuum suction of substrate holding mechanism (4) is released. Thereafter, the transport mechanism (not shown) transfers the coated substrate P out and away from the substrate holding mechanism (4). Then the operation returns to step S2 and waits for the arrival of the next substrate P.

Figure 9:
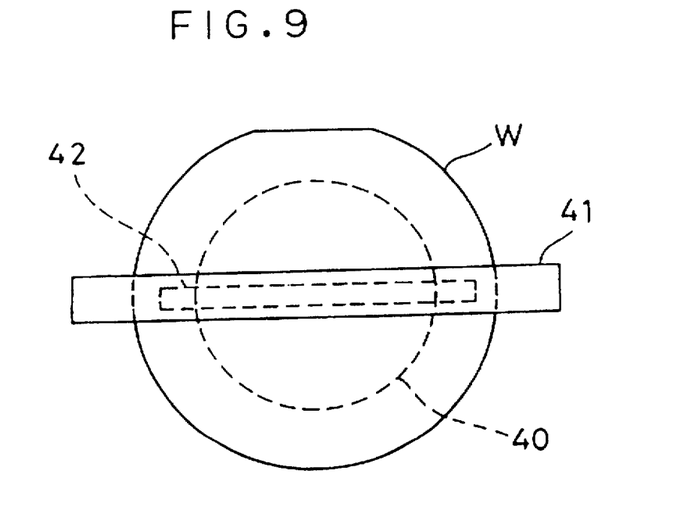
FIG. 9 is a top view showing the relationship between a substrate and the nozzle in an alternate embodiment of the coating device where the substrate is generally circular.

In the above described embodiment of this invention, it is preferable for the substrate P to be rectangular. In an alternate embodiment shown in FIG. 9, it is preferable for the substrate W to be disc shaped.

Figures 10A, 10B:
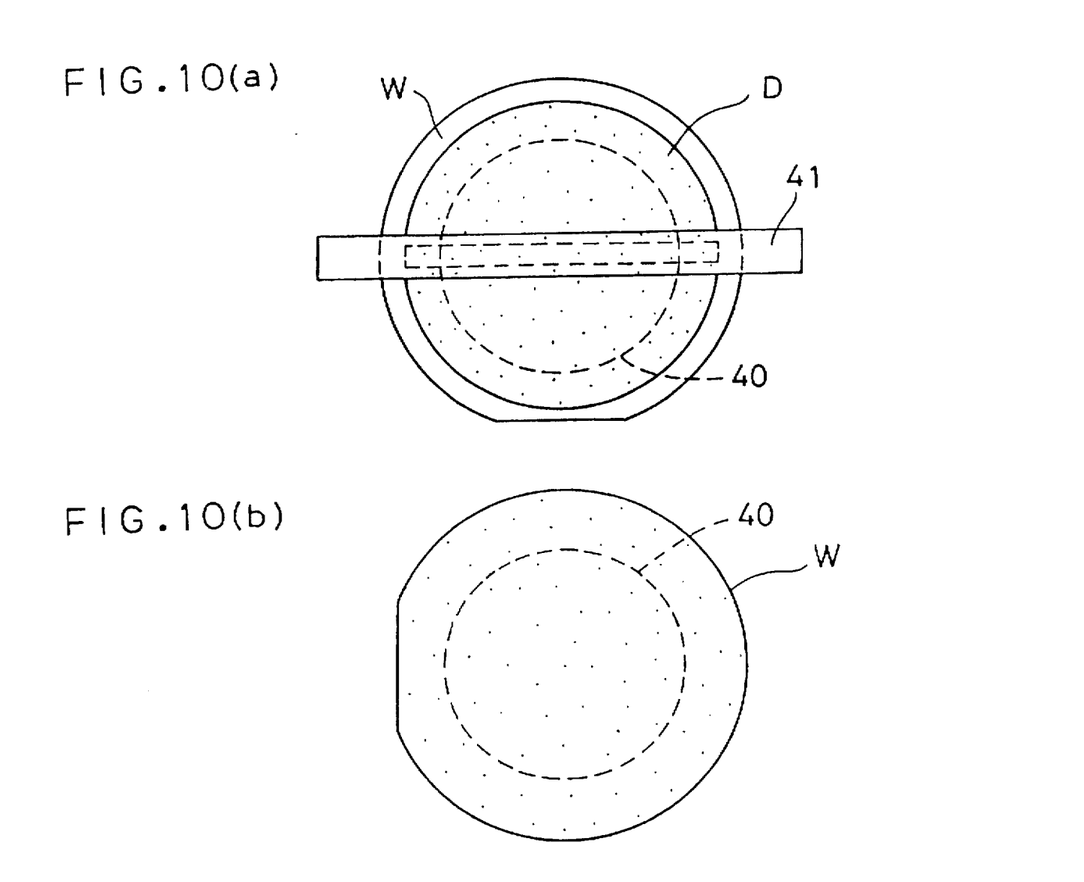

In the alternate embodiment with the disc shaped substrate W, a nozzle (41) is disposed over a rotatable substrate holding mechanism (40). The nozzle (41) has a slit (42), the length of which is shorter than the diameter of a disc-shaped substrate W. Here, as shown in FIG. 10(a), the nozzle supplies a photoresist liquid (D) to a specified region smaller than the entire surface of the substrate W while the substrate holding mechanism (40) is rotated at a relatively low speed.

When the liquid coating process is complete, the nozzle (41) is retracted to a predetermined position away from the substrate so as not to interfere with subsequent steps, and the substrate holding mechanism (40) is rotated at a relatively high speed. As shown in FIG. 10(b), centrifugal force distribute the photoresist liquid D over the entire surface of the substrate W resulting in a photoresist layer having a predetermined thickness.

Figure 11:
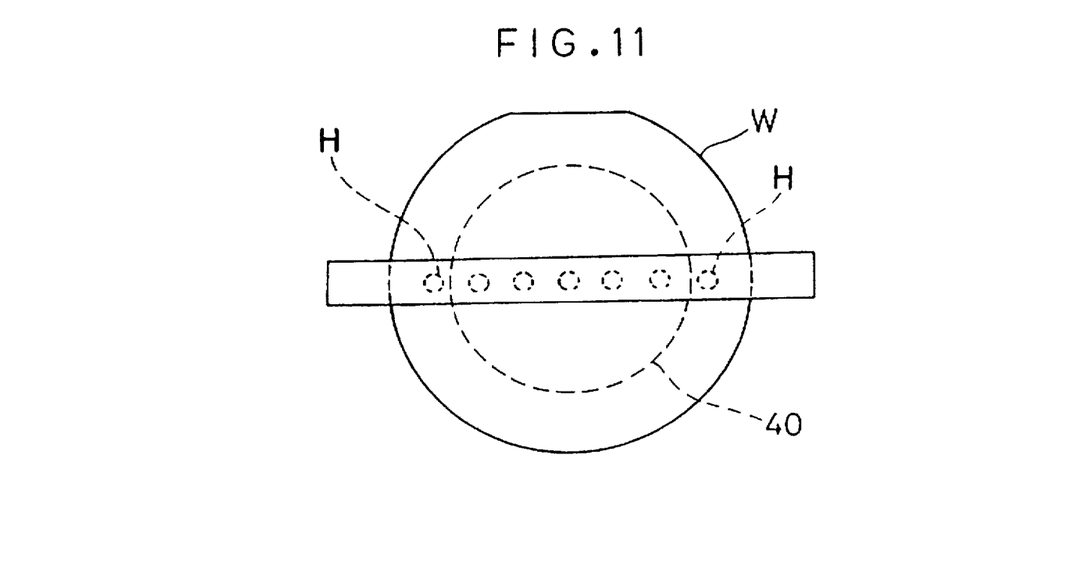
FIG. 11 is a top view similar to FIG. 9, showing the relationship between a substrate and an alternate embodiment of the nozzle.

In another embodiment of the present invention, the slit (20) of the nozzle (7) may be replaced with a plurality of needle-like liquid supply portions arranged in the longitudinal direction on the tip of the nozzle (7) or similarly with a plurality of narrow liquid supply holes H as is shown in FIG. 11.

In the coating device and the coating methods of the present invention, the rotation of the substrate holding mechanism causes movement of photoresist liquid D applied to the surface of the substrate P. However, the liquid is supplied to a region of the surface of the substrate that is smaller than the entire region of the substrate surface. The rotation of the substrate P causes the photoresist liquid D to cover the entire surface of the substrate evenly and a relatively small amount of excess liquid may be thrown from the substrate surface due to the rotation of the substrate P. Consequently, even though the amount of photoresist liquid applied to the surface of the substrate P is small, photoresist liquid can be diffused over the entire surface of the substrate, creating a photoresist layer having a specified thickness.

With the simple construction of the liquid supply nozzle of the present invention, liquid can be readily supplied at a specified region. Further, when the substrate is rectangular, the coating device may be of simpler construction providing a means and a method for moving the nozzle over the surface of the substrate, as opposed to a movable substrate holding portion. Moreover, when the nozzle has a liquid storing chamber the liquid can be more evenly supplied.

In the coating method, when the substrate is rectangular, by supplying the liquid over the upper surface of the substrate in a single direction, liquid can easily be supplied to an entire specified surface. Moreover, when the substrate has a disc shape, by rotating the substrate, the movement of the nozzle becomes unnecessary.

Various details of the invention may be changed without departing from its spirit nor its scope. The foregoing description of the embodiments according to the present invention is provided for the purpose of illustration only, and not for limiting the invention as defined by the appended claims and their equivalents.

What is claimed:

1. A device for coating a substrate having a length with a predetermined treating fluid, said device comprising:
   means for holding said substrate in a horizontal position;
   treating fluid supply means comprising a treating fluid supply nozzle for supplying treating fluid to said substrate, said treating fluid supply nozzle extending substantially along at least said length of said substrate held in said means for holding;
   movement means capable of a movement of said treating fluid supply nozzle in a direction perpendicular to said length of said substrate, and said treating fluid being supplied to said substrate during said movement; and
   means for rotating said substrate held by said holding means around a vertical rotational axis of said substrate after said treating fluid is supplied to said substrate.

2. The device according to claim 1, wherein said treating fluid supply nozzle has a liquid supply outlet through which said treating fluid is supplied onto a surface of the substrate, said liquid supply outlet having a length smaller than the length of the surface of the substrate with respect to the direction along the length of said liquid supply outlet.

3. The device according to claim 2, wherein said treating fluid supply means further includes means for temporarily storing said liquid to be supplied on the surface of the substrate through said liquid supply outlet.

4. A device according to claim 1, wherein said treating fluid supply nozzle further includes a treating fluid supply outlet through which said treating fluid is supplied onto a surface of said substrate, said treating fluid supply outlet having a slit which extends along a length of said treating fluid supply nozzle.

5. The device according to claim 4, wherein said substrate has a rectangular shape and wherein said treating fluid supply means includes means for shifting said treating fluid supply nozzle in a direction perpendicular to the length of said liquid supply outlet.

6. The device according to claim 1, wherein said substrate has a disc shape and wherein said rotating means includes means for rotating the substrate around the rotational axis while said liquid is supplied.

7. A device according to claim 1, wherein said treating fluid supply nozzle further includes a treating fluid supply outlet through which said treating fluid is supplied onto a surface of said substrate, said treating fluid supply outlet including a plurality of needle-like fluid supply portions which extend along a length of said treating fluid supply nozzle.

8. A device according to claim 1, wherein said treating fluid supply nozzle further includes a treating fluid supply outlet through which said treating fluid is supplied onto a surface of said substrate, said treating fluid supply outlet having a plurality of small holes formed therein.

9. A device for coating a substrate having a length with a predetermined treating fluid, said device comprising:
   means for holding and rotating said substrate in a horizontal position;
   a treating fluid supply nozzle selectively positionable above an upper surface of said substrate, said treating fluid supply nozzle extending substantially along said length of said substrate and being capable of supplying treating fluid substantially along at least said length of said upper surface of said substrate, said treating fluid supply nozzle being capable of being moved in a direction perpendicular to said length of said substrate, and said treating fluid supply nozzle having at least one fluid supply outlet;
   fluid supply means for supplying treating fluid to said treating fluid supply nozzle; and
   control means for controlling rotation of said substrate holding and rotating means, movement of said treating fluid supply nozzle, and supplying of said treating fluid by said treating fluid supply nozzle.

10. The device according to claim 9, wherein said substrate has a horizontal length and a horizontal width where the length of said substrate extends in a first direction and the width of said substrate extends in a second direction, and said fluid supply outlet is a single elongated opening that extends a distance relative to said substrate in said second direction smaller than the width of said substrate.

11. The device according to claim 10, wherein said treating fluid supply nozzle is moveable in said first direction at a right angle to said second direction.

12. The device according to claim 9 wherein said nozzle has a liquid storing chamber on an upstream side of said fluid supply outlet.

13. The device according to claim 9 wherein said substrate, which said device coats, has a horizontal length and a horizontal width where the length of said substrate extends in a first direction and the width of said substrate extends in a second direction, and said fluid supply outlet is a plurality of spaced apart openings.

14. The device according to claim 9 wherein said substrate, which said device coats, has a generally circular shape and said nozzle is positionable generally centered with respect to said circular shaped substrate for applying fluid to the upper surface of said substrate.

15. A device according to claim 14, wherein said control means executes said relative movement of said substrate and said treating fluid supply nozzle by rotating said substrate.

16. The device according to claim 9 wherein said fluid supply outlet defines an area that has a width smaller in width than the width of the substrate.

17. A device for coating a substrate having a length with a predetermined treating fluid, said device comprising:

- a holding device to hold said substrate in a horizontal position;
- a treating fluid supply device which includes a treating fluid supply nozzle for supplying treating fluid to said substrate, said treating fluid supply nozzle extending substantially along at least said length of said substrate;
- a movement device capable of a movement of said treating fluid supply nozzle in a direction perpendicular to said length of said substrate, and said treating fluid being supplied to said substrate during said movement; and
- a rotating device to rotate the substrate held by said holding device around a vertical rotational axis after said treating fluid is supplied to said substrate.

* * * * *

UNITED STATES PATENT AND TRADEMARK OFFICE
CERTIFICATE OF CORRECTION

PATENT NO.   : 5,782,978
DATED        : Jul. 21, 1998
INVENTOR(S)  : Kinose et al.

It is certified that error appears in the above-identified patent and that said Letters Patent is hereby corrected as shown below:

On the title page of the patent at [73], change the Assignee to:

--Dainippon Screen Mfg. Co., Ltd., Kyoto, Japan, and Sharp Kabushiki Kaisha, Osaka, Japan--

Signed and Sealed this

Tenth Day of August, 1999

Attest:

Q. TODD DICKINSON

*Attesting Officer*     *Acting Commissioner of Patents and Trademarks*